(12) United States Patent  
Nakamura et al.

(10) Patent No.: US 6,694,613 B2  
(45) Date of Patent: Feb. 24, 2004

(54) METHOD FOR PRODUCING A PRINTED-CIRCUIT BOARD HAVING PROJECTION ELECTRODES

(75) Inventors: Yoshifumi Nakamura, Neyagawa (JP); Minehiro Itagaki, Moriguchi (JP); Hiroaki Takezawa, Katano (JP); Yoshihiro Bessho, Higashiosaka (JP); Tsukasa Shiraishi, Takatsuki (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 53 days.

(21) Appl. No.: 09/873,461

(22) Filed: Jun. 5, 2001

(65) Prior Publication Data

US 2001/0029666 A1 Oct. 18, 2001

Related U.S. Application Data

(62) Division of application No. 09/106,302, filed on Jun. 29, 1998, now Pat. No. 6,300,576.

(30) Foreign Application Priority Data

Jun. 30, 1997 (JP) ............................................ P 9-173870

(51) Int. Cl.$^7$ ............................... H05K 3/02; H05K 3/10
(52) U.S. Cl. ............................... 29/846; 29/830; 29/843; 29/848; 29/625; 428/210
(58) Field of Search .......................... 29/846, 843, 848, 29/830, 625; 428/210, 209, 131

(56) References Cited

U.S. PATENT DOCUMENTS

| 4,541,894 | A | | 9/1985 | Cassat |
| 5,085,720 | A | * | 2/1992 | Mikeska et al. ......... 156/89.14 |
| 5,450,290 | A | | 9/1995 | Boyko et al. |
| 5,484,647 | A | * | 1/1996 | Nakatani et al. ............ 428/209 |
| 5,525,402 | A | * | 6/1996 | Nakamura et al. .......... 428/210 |
| 5,547,902 | A | * | 8/1996 | Rohner ....................... 438/613 |
| 5,600,103 | A | | 2/1997 | Odaira et al. |
| 5,766,670 | A | | 6/1998 | Arldt et al. |

FOREIGN PATENT DOCUMENTS

| JP | 7-147464 | 6/1995 |
| JP | 7-202422 | 8/1995 |
| JP | 8-88470 | 4/1996 |

* cited by examiner

Primary Examiner—Carl J. Arbes
Assistant Examiner—T. D. Phan
(74) Attorney, Agent, or Firm—Wenderoth, Lind & Ponack, L.L.P.

(57) ABSTRACT

A method for producing a printed-circuit board includes forming via holes that penetrate through a prepreg to whose surface a parting film is applied; filling the via holes with a conducting paste; compressing the prepreg under heat to cure the prepreg and the paste; and then peeling off the parting film. Thus, projection electrodes with a height corresponding to the thickness of the film are formed in a manner such that the projection electrodes are integrated with the via hole conductors.

25 Claims, 9 Drawing Sheets

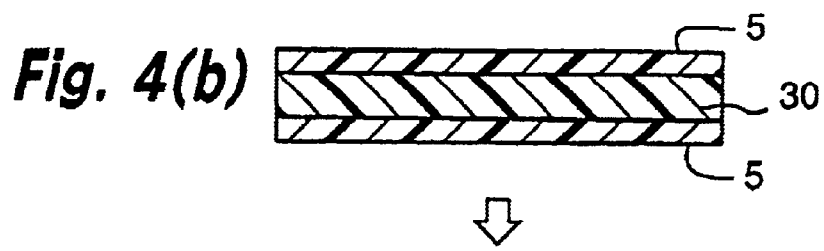
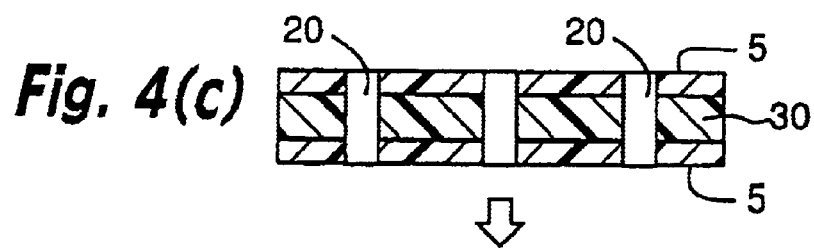
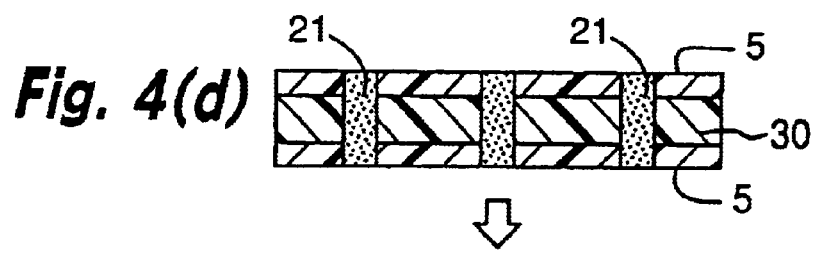
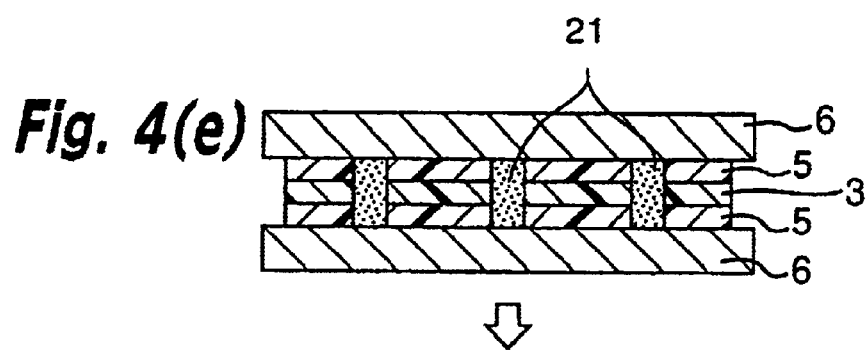
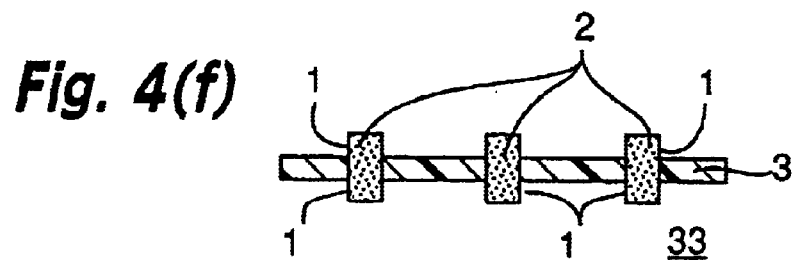

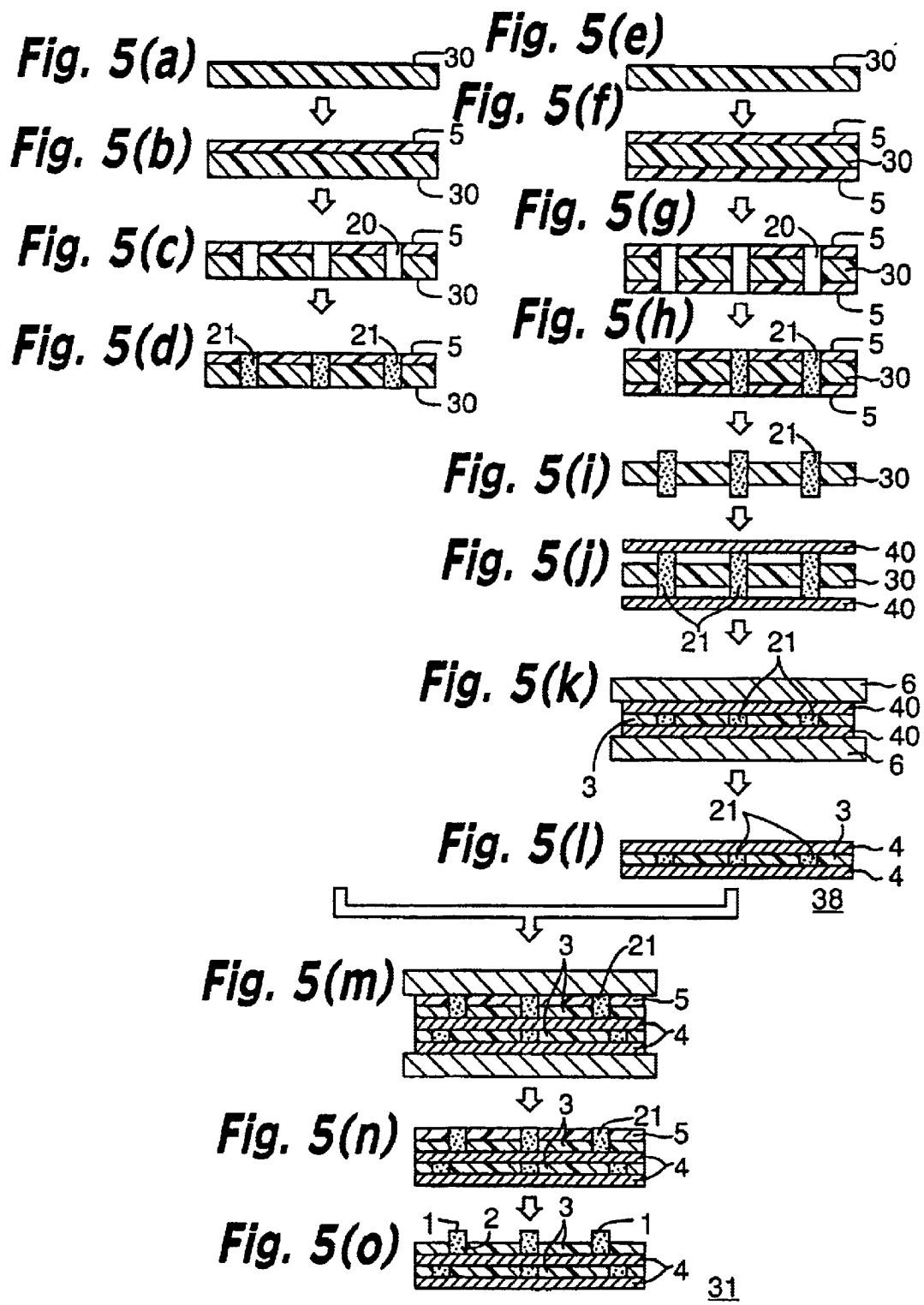

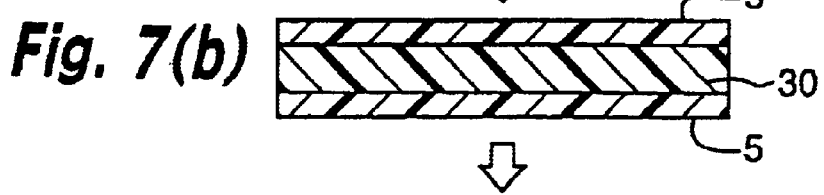
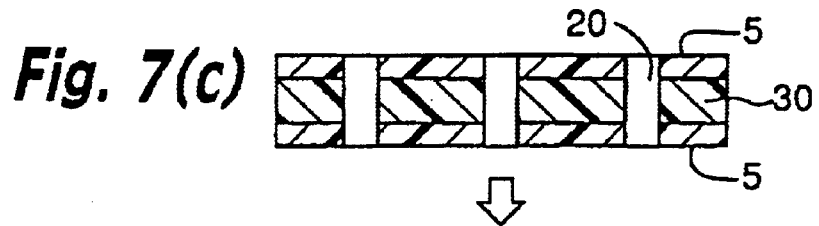
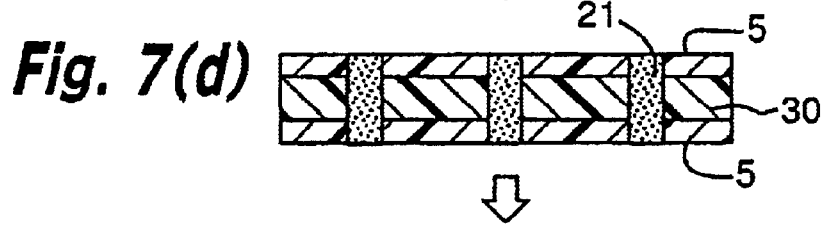
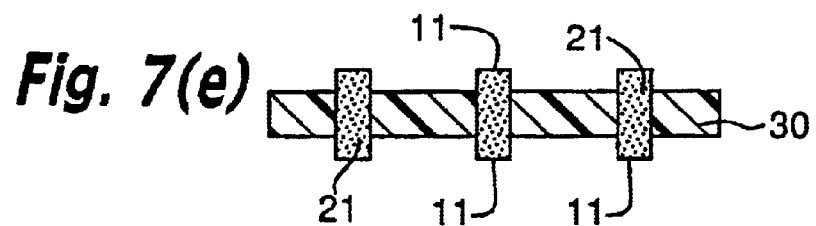
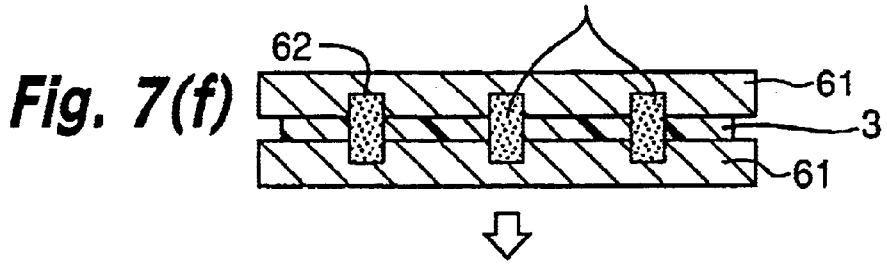
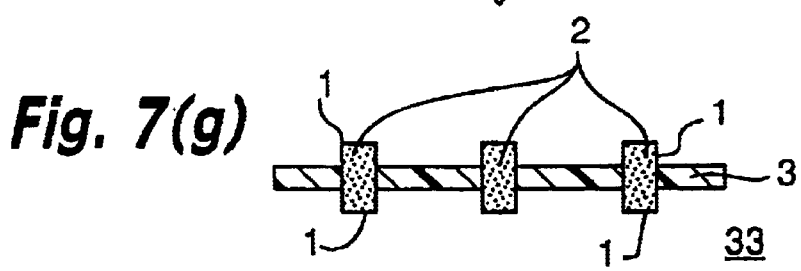

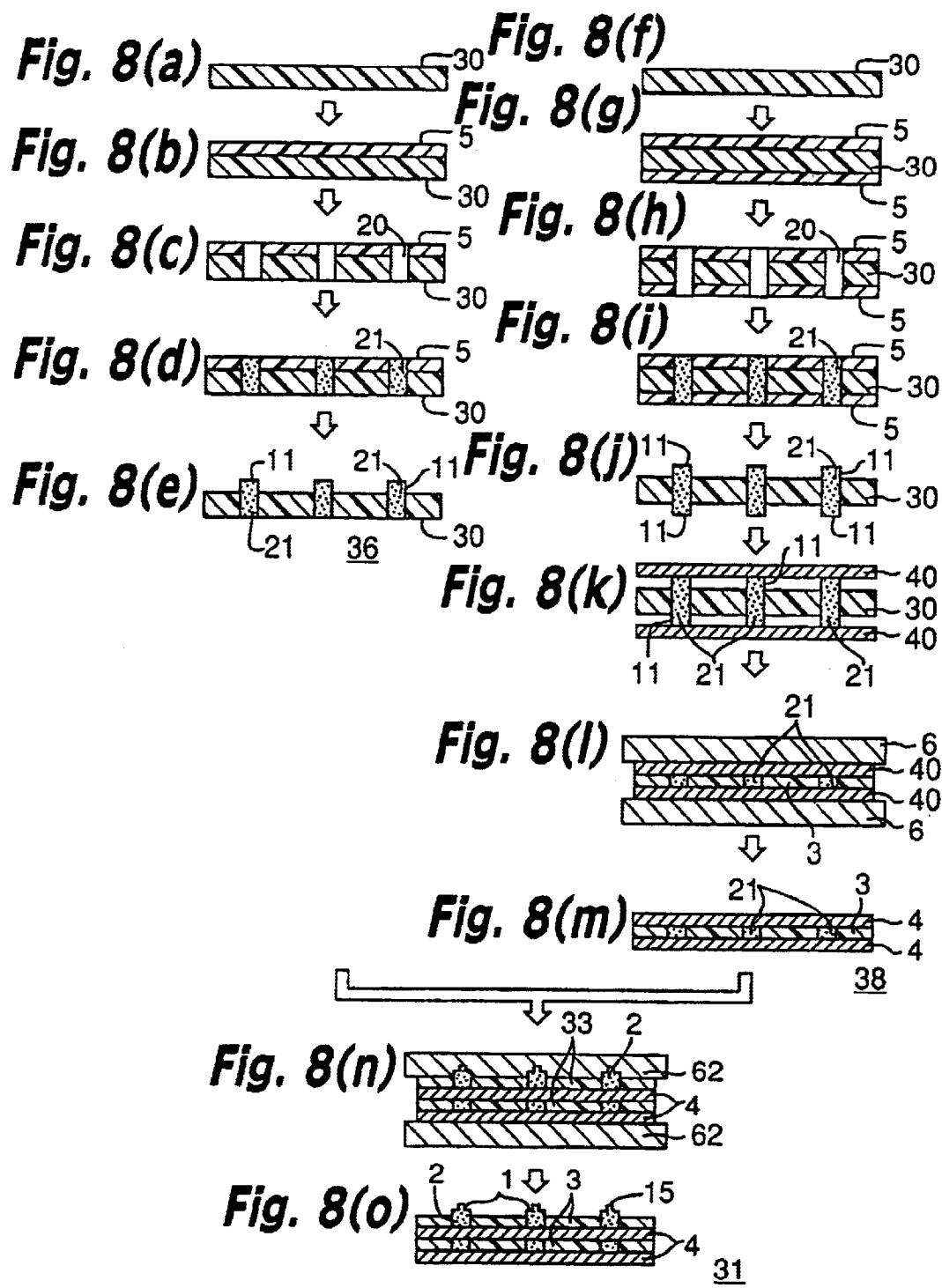

METHOD FOR PRODUCING A PRINTED-CIRCUIT BOARD HAVING PROJECTION ELECTRODES

This is a divisional application of Ser. No. 09/106,302, filed Jun. 29, 1998, now U.S. Pat. No. 6,300,576.

BACKGROUND OF THE INVENTION

1. Field of the Invention

The present invention relates to a printed-circuit board having projection electrodes which is mounted with semiconductor devices or other electronic components and a method for producing such a printed-circuit board.

2. Prior Art

Printed-circuit boards have packaging electrodes for electrically connecting one or more semiconductor devices and other electronic components mounted thereon. These printed-circuit boards are multilayered and formed with electric conductors, particularly, inter-connectors which are connected to the surface electrodes and interposed between the inner insulating layers of the multilayer structure, allowing highly densified electronic components to be mounted.

The miniaturization and high-speed performance for packaging the semiconductor devices for recent electronic devices have led to a significant tendency, to use a package free from leads, which is formed with grid array connecting electrodes on the backface of the package, as called ball grid array (BGA). Because such a package, which differs from a quadflat package (QFP), has no connecting leads extending externally, miniaturized packaging and high-speed performance can be attained.

For instance, FIG. 10 shows a land grid array package 101 in which a semiconductor chip 9 is mounted on a carrier substrate 103 (see J. Nikkei Electronics, Aug. 2 (1993) pages 104–118).

For packaging the above BGA, balls 111 composed of a solder are attached on the package 103 in an array of each terminal electrode 102 of the package which is mounted on a printed circuit board (not shown) having electrodes with the same array as the terminal electrodes through the solder balls 111. In this package, the solder balls 111 are made larger in diameter whereby the package 103 mounted on the printed-circuit board is increased in height. This relieves a shearing stress produced by mismatching or displacement of the package 101 relative to the printed-circuit board caused by thermal expansion due to changes in atmospheric temperature.

The projection electrodes including bumps such as the above solder balls are formed on a printed circuit board, not to the package of a semiconductor device or electronic components. It is advantageous in view of mass production and cost that the projection electrodes are attached to the side of the printed-circuit board.

There is known ceramic substrates having a structure in which the above package electrode projects from the surface of the substrate. Such a structure is disclosed in Japanese Patent Publication JP-A 8-88470. In the substrate, two or more green sheets of insulating ceramics material are laminated with conductive patterned foils between the sheets and thorough-holes opened on the surface of the laminated body. Then, a film, which is easily burned out at a low temperature, is covered on the multi-layer laminated body. The film is previously formed with through holes corresponding to the terminal electrodes formed on the bottom of an integrated circuit, for example, and filed with a conducting connecting material into the holes and laminated by pressing. Thereafter the substrate is then fired to burn out the film, thereby forming projection electrodes by sintering the filled material in the holes.

Japanese Patent Publication JP-A 7-202422 discloses a method in which for forming projection electrodes a ceramic film having a high softening point with a plurality of through-holes is formed on at least one surface of a laminated ceramic green sheets. The through-holes are filled with a conducting paste. As the laminated body is fired to be sintered without sintering the film which is delaminated off to leave projection electrodes on the substrate. For the film for forming the projection electrode, a material such as aluminum powder which can never be sintered at the firing temperature of the ceramic green sheet is utilized, thereby facilitating the peeling after sintering. The projection electrodes composed of the metal differing from the conductive material for the via hole, and, for example, silver is preferably utilized.

As the ceramic substrate having such projection electrodes is used for mounting the electronic components, a bonding defect and cracks in the rigid projection electrode are caused by their deformation stresses due to mismatching of these numerous electrodes of the electronic components with the same number of projection electrodes bonded onto the above substrate.

As for the above-mentioned synthetic resin substrate, FIG. 12 shows a conventional example of the projection electrodes formed on a printed-circuit board. First, a printed-circuit board is formed using a glass fiber reinforced epoxy resin substrate 3, interlayer via hole conductors 2 by metallizing the through-holes, and patterned electrodes 3 of a copper foil. Thereafter, connecting projection electrodes 121, which are tens of micrometers in height and is composed of a metal such as Au, Ag, Cu, or a solder alloy, are formed on electrode portions of the substrate by means of a plating method or screen printing method using a mask.

The printed-circuit board with the projection electrode is mounted with semiconductor devices or other electronic components to constitute a multichip module (MCM) or utilized as a motherboard for mounting bare chips.

Though not for packaging projection electrodes, a technology is disclosed in Japanese Patent Publication JP A 7-147464 in which a multilayer resin substrate is formed by lamination using a plurality of resin prepregs each of which conducting pasts are projected on the surface. Particularly, in this technology, parting films is applied to both faces of each of the resin prepreg, having the through holes which are filled with a conductive paste, and peeled off as the past is uncured to form the prepreg with the filled paste projecting from the both faces thereof. A prescribed number of the prepregs and the patterned copper foils are alternatively multiplied into a lamination, and then both lamination faces are pressed under heat to cure the prepregs, thereby securing the connection between conductors in each layer in the substrate.

However, in above-mentioned land grid array-type printed-circuit board made of a synthetic resin, the packaging projection electrodes have been formed by a screen printing or metal plating method on the corresponding electrodes formed from patterned metal foils after the printed board is cured. In this case, the adhesive strength between the projection electrode and the electrode on the printed-circuit board is low because of different materials and different formation processes. Also, in such a printed-circuit board formed with via holes, it is necessary to fill up the via holes with a conducting resin past for forming the projection electrodes thereon, posing the problem of an increase in steps.

SUMMARY OF THE INVENTION

An object of the present invention is to provide a printed-circuit resin board having packaging projection electrodes which is highly flexible and resistant to an external stress to act on the projections so as to exhibit a highly adhesive strength to via holes formed in the printed-circuit board.

A further object of the present invention is to provide a method for producing a circuit board having such projection electrodes which are easily formed.

Accordingly, the above object can be attained by the provision of a printed-circuit board wherein projection electrodes composed of conductive paste projecting from the surface are connected integrally with the via holes conductors filled with the conductive paste. The via hole are formed in insulating resin substrates to make up the board.

Particularly, the present invention resides in a printed-circuit board in which via hole conductors composed of a conducting paste is formed in the insulating resin substrate. The printed-circuit board is characterized in that the projection electrodes are produced by curing a conducting paste and integrated with, and secured to, the via hole conductors, projecting from the surface of the substrate.

The present invention includes the printed-circuit board on which such projection electrodes connected integrally with the via holes and projected from the front surface and the back face of the substrate.

In the invention, because the projection electrode and the via hole conductor disposed on the printed-circuit board are integrally formed of the same material, the adhesive strength between the both is large and variations in the strength of the projection electrodes can be reduced.

In the invention, the use of the same conducting paste as the via hole conductor enables it possible to form the via hole conductor and the projection electrode simultaneously, which is effective in simplifying the process and reducing the product cost.

According to a further aspect of the present invention, there is provided a method for producing a printed-circuit board comprising filling, with an conducting paste, the via holes in a prepreg provided with a parting film, pressing and heating the prepreg to cure it into a board, and in succession peeling the parting film form the board to expose the projections. In the invention, the projection electrodes consist of the cured conducting paste and have an appropriate height from the board corresponding to the thickness of the parting film.

Preferably the projection electrodes are formed on the position corresponding to the via holes by interposing and pressing the substrate using molds with concave portions for forming the projections. The projection electrodes can be shaped into a desired and accurate finished form by utilizing the molds.

Preferably porous prepregs is used for the insulating resin substrate of the printed circuit board. This has an advantage in that the conductive paste with which the via holes are filled is allowed to project from the surface of the substrate with ease and at the same time the projection electrodes can be formed in one step of heating the prepreg under pressure.

BRIEF DESCRIPTION OF THE DRAWINGS

In the accompanying drawings, there are shown illustrative embodiments of the invention from which these and other of its objectives, novel features, and advantages will be readily apparent.

In the drawings:

FIG. 4 is a series of sectional views illustrating steps of forming a printed-circuit board having projection electrodes on both faces of a substrate corresponding to Example 1 in the present invention;

FIG. 5 is a series of sectional views illustrating production steps of forming a multilayer printed-circuit board having projection electrodes corresponding to another example in the present invention;

FIG. 7 is a series of sectional views illustrating production steps of forming a printed-circuit board having projection electrodes on both faces of a substrate corresponding to a still further example in the present invention;

FIG. 8 is a series of sectional views illustrating production steps of forming a multilayer printed-circuit board having projection electrodes corresponding to a still further example in the present invention;

DETAILED DESCRIPTION OF THE INVENTION AND PREFERRED EMBODIMENTS

The present invention will now be explained in detail.

A printed-circuit board according to the present invention is directed to a single-layer or multilayer circuit board comprising an insulating substrate, wiring electrode layers, and via hole conductors wherein projection electrodes consisting of a cured conducting paste are formed on the conducting paste with which the via holes passing through the insulating substrate is filled and which is cured so that the projection electrodes projects from the surface of the insulating substrate.

Figure 1A:
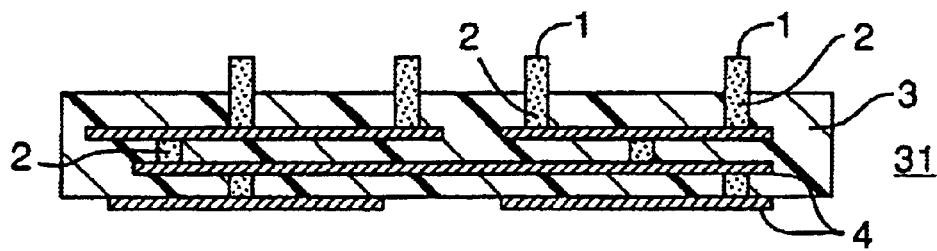
FIG. 1A is a sectional view of a printed-circuit board having projection electrodes on one face or both faces of a substrate according to the present invention and FIG. 1B is a sectional view of a printed-circuit board having projection electrodes on both faces of a substrate.
Figure 1B:
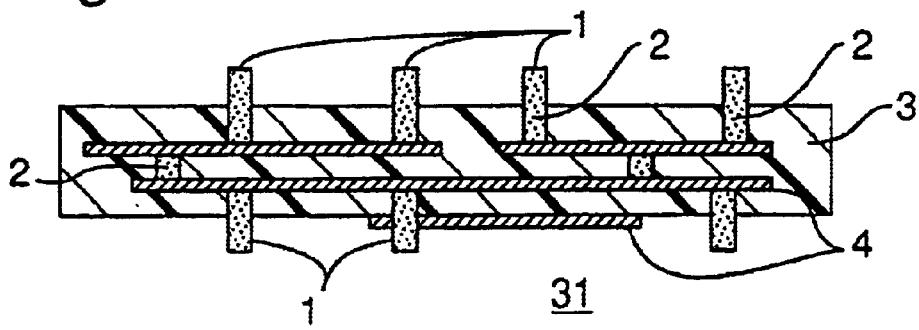

FIGS. 1A and 1B show a multilayer substrate produced by multiplying a plurality of insulating substrates 3 and wiring electrode layers 4. The via hole conductors 2 are connected to the wiring electrode layers 4 formed on both interfaces of the insulating substrate 3 respectively. The projection electrodes 1 are formed on the top of the via hole conductors 2 of the outermost insulating substrate (the most upper insulating substrate) and are projected externally from the outside surface of the multilayer substrate 31.

In the present invention, as materials for the insulating substrate 3, thermosetting synthetic resins are used and an appropriate material is selected from these resins having insulation properties, mechanical strength, heat resistance, moisture resistance, and the like into consideration. Preferably an epoxy resin is used. It is preferable that these resins may be reinforced by nonwoven fabric or woven fabric such as a glass fiber, polyimide fiber, or aramide fiber as the core material.

The non-woven or woven fabric is impregnated with the above resin to form a sheet, that is a prepreg, which is then heated and pressed whereby the resin is shaped into a plate and cured to produce an insulating substrate.

Each of the via hole conductors is formed by penetrating the prepreg to form in advance a through-hole as the via hole at the predetermined position for wiring, filling the via hole with a conducting paste, and curing the conducting paste simultaneously when the prepreg is shaped and cured under heat in a heating/pressing step of forming a resin substrate.

The projection electrode is integrated with and connected to the via hole conductor on the surface of the substrate so as to project externally.

As the conducting paste used for the projection electrodes, any conducting material may be used insofar as it can be cured by, heating simultaneously during curing of the via hole conductor. Preferably the conducting paste for the projection electrode may be in the same composition as the conducting paste for the via hole conductor and the projection electrode is formed in the same step as that of forming the via hole conductor, so that it is integrated with the via hole conductor embedded into the substrate. The projection electrode integral with the via hole conductor has therefore a structure which is highly resistant to external stress.

The conducting paste used in the present invention is prepared as a paste using conducting particles, a thermosetting resin solution, and, if necessary, a solvent. The thermosetting resin may be selected from resins which can be cured simultaneously in the above step of heating/pressing the prepreg. An epoxy resin, thermosetting polybutadiene resin, phenol resin, or polyimide resin is preferably used.

For the conducting particles, a powder of a metal material which is stable and has a low specific resistance and low mutual contact resistance. For example, a powder of Ag, Au, Cu, Pd, Sn, Pb, or Ni or powder of an alloy of these metals are preferably used.

The insulating resin substrate may be made of a porous material. Because the substrate material is compressed in a heating/pressing step when such porous material is used, the conducting paste is also compressed and the density of the conducting particles thereby increases. Therefore, the contact resistance between particles decreases whereby the bump resistance can be reduced. Among above resins for the insulating substrate, a porous sheet made of a combination of a fiber and a resin, such as an aramide fiber reinforced epoxy resin, aromatic polyimide fiber reinforced thermosetting resin (especially an epoxy resin), or glass fiber reinforced epoxy resin is preferably used.

Each of the projection electrodes is formed at the position of the surface which corresponds to the position of the electrode of a semiconductor device or other electronic components and used to connect the electrodes when the semiconductor or electronic components are mounted. In the case where the projection electrode is connected to a motherboard, it is formed at the position corresponding to each of the electrodes of the mother board.

In the production method of a printed-circuit board according to the present invention, a parting film is applied to one face or both faces of the above prepreg, which is encaved to form via holes extending from the surface to the backface of the prepreg, and the via hole is filled with a conducting paste to the same level as the film, followed by pressing under heat to cure the prepreg and the conducting paste, and thereafter the film is peeled off.

After the film is peeled off, the cured conducting paste with a height corresponding to the thickness of the film projects from the substrate. The cured conducting paste projecting from the substrate is utilized as the projection electrode. The projection electrode formed in this manner is integrated with the via hole conductor.

In this invention, as the parting film, a material is used which does not soften in the heating/pressing step. Because of this, the film requires a softening point of 200° C. or higher. A film of polyimide or polyethersulfone is preferably used corresponding to an epoxy resin used for the prepreg. The film is needed to have a thickness in accordance with the prescribed height of the projection electrode. The thickness of the film is designed to be in a range from 30 to 300 $\mu$m so that the projection electrodes with a height in a range of 30 to 300 $\mu$m can be formed. If the thickness of the film is lower than 30 $\mu$m, only an ineffective projection electrode is produced. A preferred thickness of the film may be in a range from 30 to 100 $\mu$m.

The present invention is also directed to a method of producing a printed-circuit board in which projection electrodes are formed on the surface and a metal foil is applied to the back face as wiring electrodes. Such a method comprises steps of: forming via holes in a prepreg provided with a parting film on both faces thereof; filling the via hole with a conducting paste; and peeling off the parting film formed on the one face of the prepreg to apply a metal foil onto the peeled surface; and, after the above steps, further comprising; pressing the prepreg under heat; and peeling the parting film, producing a printed-circuit board with projection electrodes. The metal foil is made into a wiring electrode by forming a desired wiring pattern.

A multilayer printed-circuit board is formed by the method of the present invention as follows: First, a first prepreg is prepared which is provided with a parting film on one face thereof and via holes filled with a conducting paste, and next, a second cured circuit board provided with metal foils applied to the both surfaces thereof is prepared. Then a multilayer printed-circuit board with projection electrodes is produced through steps of: laminating the first prepreg on the second circuit board in such a manner that an exposed surface of the first prepreg is brought into contact with the second circuit board; pressing the prepregs under heat using a press on the outside surfaces to cure the prepregs and the conducting paste and to bond the prepregs; and peeling off the parting film, obtaining the substrate with the projection electrodes.

In the heating/pressing step in the production method according to the present invention, a method may be adopted which comprises a step of interposing and pressing the prepregs with uncured projection pasts thereon between flat molds which have projection-forming concave portions on the molding surface at the positions corresponding to the via holes. This method for producing a printed-circuit board according to the present invention comprises steps of: forming via holes in a prepreg provided with a parting film on one face or both faces thereof; filling the via holes with a conducting paste; peeling off the parting film from the prepreg; applying a metal foil on the one face of the prepreg from which the parting film is peeled off; and interposing and pressing the substrate under heat using molds having projection-forming concave portions at the positions corresponding to the via holes which have been filled with the conducting paste.

Particularly, this production method comprises: filling the via holes of the prepreg with a conducting paste; peeling off the parting film from the prepreg; and interpose and pressing the prepreg under heat between the molds having concave portions at the positions corresponding to the via holes which have been filled with the conducting paste.

Figure 2:
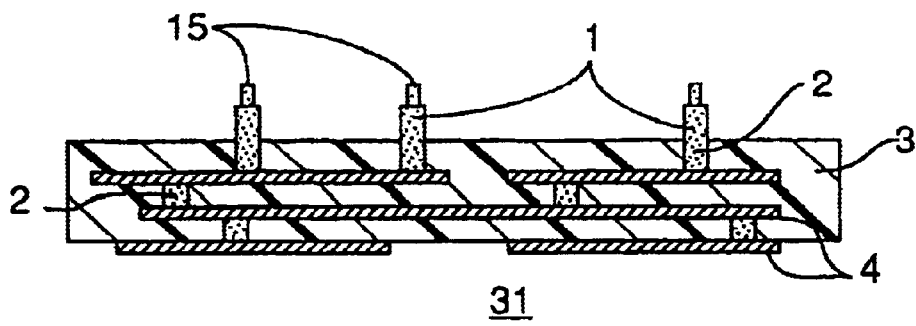
FIG. 2 is a sectional view of a printed-circuit board having a two-stage projection electrode according to the present invention.
Figure 3A:
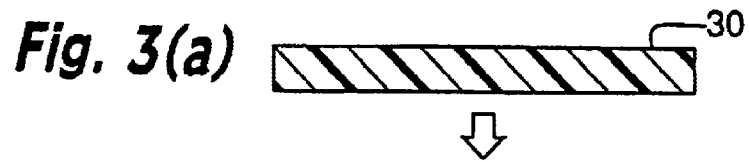
FIG. 3 is a series of sectional views illustrating steps of forming a printed-circuit board having projection electrodes corresponding to an example in the present invention.
Figure 3B:
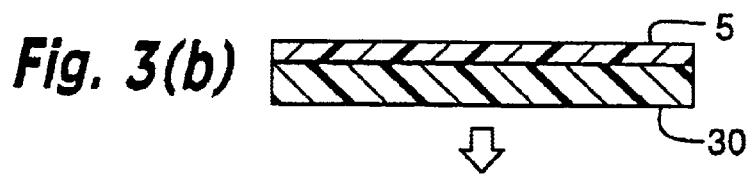
Figure 3C:
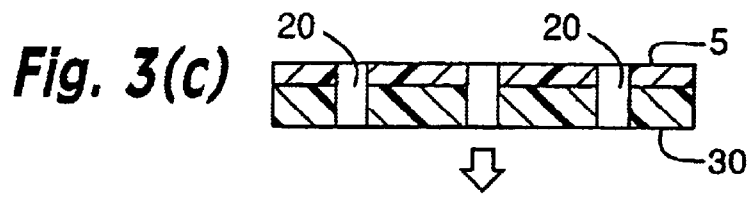
Figure 3D:
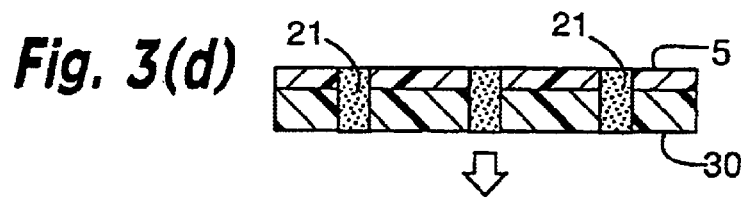
Figure 3E:
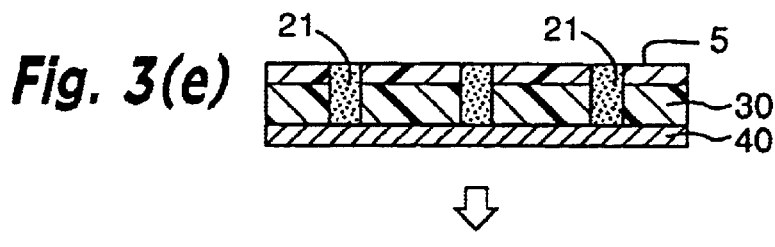
Figure 3F:
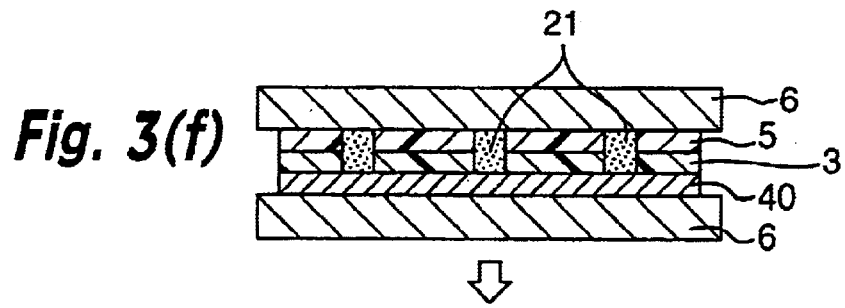
Figure 3G:
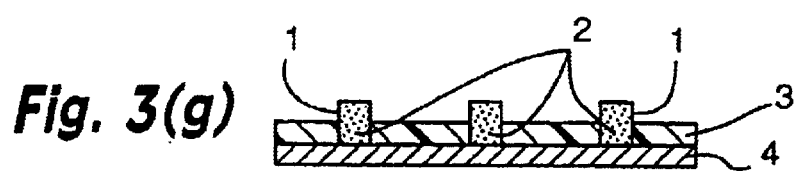

In this method, since the mold is formed with concave portions in accordance with the positions of the projection electrodes, the projection electrodes can be formed with a desired shape such as a circular cone and two-stage projection on the printed-circuit board after pressing. For example, FIG. 2 shows a multilayer printed-circuit board 31 having projection electrodes 1 with two-stage form formed on the top. The projection electrodes consisting of the two-stage projections 15 prevents the occurrence of shortage to adjacent projections caused by the variations in the amount of a binding media such as a conducting adhesive when the electrodes of a semiconductor component or other electronic components are electrically connected to the circuit board, because a retention of the binding media is produced in the stage of the projections.

This method of using the molds with the concave portions can be adapted to the cases of forming projection electrodes on one face and both faces of the printed-circuit board.

The method of shaping the projection electrodes using the molds is adapted to the first prepreg used in the method in which the first prepreg is applied on the second circuit board to form a multilayer printed-circuit board. Particularly, the step of laminating the first prepreg on the second circuit board in such a manner that an exposed surface of the first prepreg is brought into contact with the second circuit board is followed by the step of pressing the surface on the side of the parting film on the first prepreg under heat using the molds to cure the prepreg and the conducting paste and a step of peeling off the parting film, to form projection electrodes. In addition, a step may be adopted in which, before using the molds to interpose and press the prepreg, the parting film attached on the first prepreg is peeled off to expose projecting portions of the conducting paste, and the laminated prepregs are then interposed and pressed using the molds having the concave portions to form the projection electrodes on the first prepreg cured.

The multilayer circuit board formed with projection electrodes on one face thereof, as shown in FIG. 1A, can be used as a MCM board or a board for mounting bare chips. The multilayer circuit board formed with projection electrodes on both faces thereof, as shown in FIG. 1B, can be particularly used as a carrier board for CSP (chip-size packaging).

Figure 9:
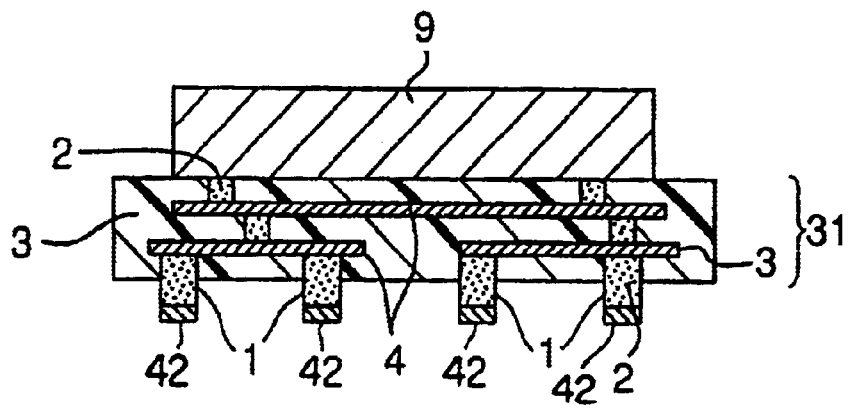
FIG. 9 is a sectional view of a semiconductor package showing an applied example of a printed-circuit board having projection electrodes according to the present invention.
Figure 10:
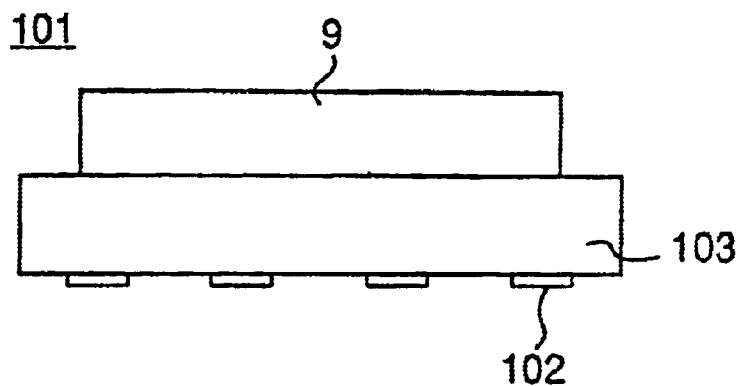
FIG. 10 is a sectional view of a conventional land grid array type package.
Figure 11:
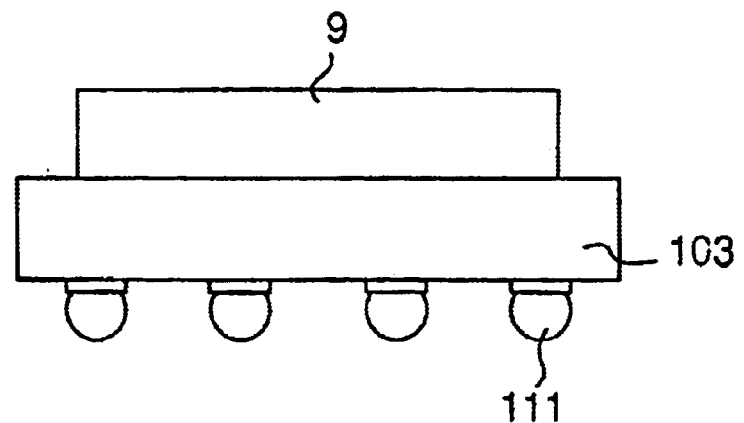
FIG. 11 is a sectional view of the conventional package with ball grid array using a solder ball.
Figure 12:
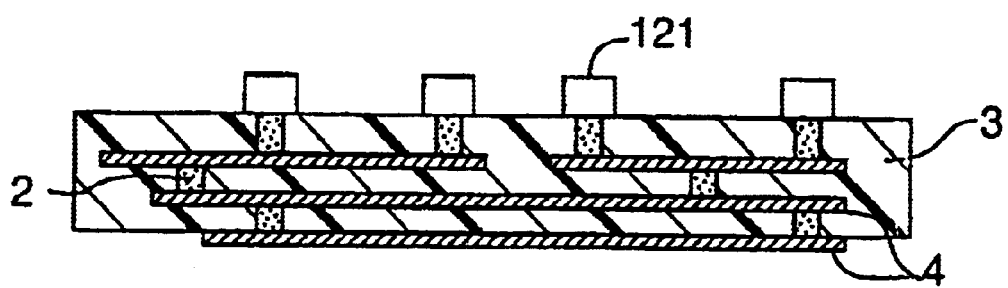
FIG. 12 is a sectional view of the conventional land grid array-type semiconductor package formed with projection electrodes by a conventional plating method.

In FIG. 1A, each projection electrode 1 is formed on the substrate 31 at the position corresponding to the position of an electrode of semiconductor devices or other electronic components to be mounted, to enable flip-chip packaging above for the semiconductor devices and other electronic components. If each projection is formed at the position corresponding to the position of the electrode of a mother board, the multilayer circuit board can used to be mounted on the mother board. In FIG. 1B, each projection electrode 1 on both surfaces may be formed on the front surface at the position corresponding to the position of the electrode of semiconductor devices or other electronic components, and on the backface corresponding to the position of the electrode of a motherboard, whereby it can be used as a CSP carrier board and thus a CSP shown in FIG. 9 can be produced.

EXAMPLES

The present invention will be explained in more detail by way of examples, which are not intended to be limiting of the present invention.

Example 1

A method for producing a printed-circuit board according to the present invention will be explained with reference to FIG. 3, which shows sectional views as a flow chart illustrating a method for manufacturing the printed-circuit board of the present invention.

First, a polyimide resin film (thickness: 0.1 mm, manufactured by Hitachi Chemical Co., Ltd.), which was subjected to releasing treatment, as a parting film 5 was applied to one face of an aramide fiber reinforced epoxy resin sheet (Trademark: TA-O1, manufactured by Teijin Ltd.) as an uncured prepreg 30 using a heat roller (see Steps (a) and (b) in FIG. 3).

Then, via holes 20 (diameter: 0.2 mm) were made using an excimer laser at an optional position (see (c) in FIG. 3). Next, the via holes were filled with an conducting paste 21 containing Ag as a conducting filler and an epoxy resin as a binder by a screen printing method (see (d) in FIG. 3). This operation was carried out while aspirating from the backface.

Thereafter, a Cu foil (thickness: 0.035 mm) as a metal foil 40 was applied to the face of the prepreg 30, to which the parting film was not applied using a heat roller (see (e) in FIG. 3). In succession, the both surfaces of the prepreg to which the parting film 5 and the Cu foil 4 were applied respectively were interposed by a pair of flat molds 6, 6. The resulting substrate sandwiched with the plate molds 6 was heated at a temperature of 170° C. and at the same time pressed at a pressure of 60 to 100 kg/cm$^2$ for one hour using a hot press to bond the parting film 5 with prepreg 30 by thermocompression (see (f) in FIG. 3).

The prepreg 30 was compressed by 10% by the above hot press into a board. The compressibility may be in a range from 5% to 40%.

The parting film 5 composed of a polyimide resin did not melt, since the melting point of the polyimide resin is higher than the pressing temperature.

After that, the substrate 3 was separated from the molds 6, 6 and the parting film 5 was peeled off (see (g) in FIG. 3). The Cu foil was formed with a wiring pattern after this as required. Thus, a printed-circuit board 37 was obtained, which had projection electrodes 1 integrated with via hole conductors 2 composed of the same conducting paste cured in the above manner and which had a height corresponding to the thickness of the parting film 5.

FIG. 4 shows steps of producing a printed-circuit board having projection electrodes 1 on both faces thereof according to the method of the present invention. This production method is the same as that illustrated in FIG. 3 except that parting films 5 are applied to the both faces (see Step (b) in FIG. 4).

After the pressing step (see (e) in FIG. 4), the parting films 5 were peeled off to produce a printed-circuit board with projection electrodes 1 which were integrated with via hole conductors 2 composed of a cured conducting paste on both faces of a substrate 3 and which had a height corresponding to the thickness of the parting film (see (f) in FIG. 4).

Example 2

FIG. 5 shows sectional views illustrating steps for producing a multilayer printed-circuit board according to the present invention. A parting film 5 of polyimide resin (thickness: 0.1 mm, manufactured by Hitachi Chemical Co., Ltd.), which was subjected to releasing treatment, was applied to one face of an aramide fiber reinforced epoxy resin sheet (Trademark: TA-O1, manufactured by Teijin Ltd.) as an uncured prepreg 30 by hot rolling (see Steps (a) and (b) in FIG. 5) Then, via holes 20 (diameter: 0.2 mm) 20 were made using a carbon dioxide gas laser at optional positions (see (c) in FIG. 5). Next, the via holes were filled with a conducting paste 21 containing Ni particles as an conducting filler and an epoxy resin as a binder using a screen printing method (see (d) in FIG. 5). This operation was carried out while aspirating the holes from the backface of the prepreg 30. As a consequence, the prepreg 30 having the parting film 5 on one face was produced.

On the other hand, the same parting films 5 as above were applied to both faces of a prepreg 30 composed of another aramide fiber reinforced epoxy resin sheet (see (e) and (f) in FIG. 5), in the same manner as above, and the prepreg 30 was thus produced in which via holes 20 were formed (see (g) in FIG. 5). The via holes were filled with the same conducting paste as above (see (h) in FIG. 5), followed by peeling off the parting films 5, 5 (see (i) in FIG. 5), and a pair of Cu foils 40, 40 (thickness: 0.035 mm) were applied to both faces of the prepreg 30, by hot rolling (FIG. 5(j)).

After that, a pair of flat molds 6, 6 made of stainless steel were placed on both surface sides of the prepreg 30. The prepreg 30 was hot pressed via the molds 6 at a temperature of 170° C. and a pressure of 60 to 100 kg/cm$^2$ for one hour (see (k) in FIG. 5) to carry out a first hot pressed bonding and thereby to obtain a printed-circuit board 38 (see 5(1)) having two-sided metal layers.

In this step, the conducting paste was also cured and the copper foils applied to the both surfaces of the printed-circuit board were electrically connected to the via-hole conductors.

The above prepared prepreg 30 with the parting film maintained on the face and the above cured printed-circuit board 38 were laminated and hot pressed by a pair of molds of stainless steel at a temperature 170° C. and a pressure of 60 to 100 kg/cm$^2$ for one hour, to carry out a second hot pressed bonding (see (m) in FIG. 5).

After that, the substrate was separated from the molds (see (n) in FIG. 5) and the parting film was peeled off, thereby producing a multilayer printed-circuit board 53 with projection electrodes which was integrated with via hole conductors composed of the same conducting paste and had a height corresponding to the thickness of the parting film (see (o) in FIG. 5). Then, the copper foil was etched in required wiring pattern.

Example 3

FIG. 6 illustrates the steps of producing a printed-circuit board with projection electrodes formed according to the present invention. A PET film as a parting film 5, which was subjected to releasing treatment was applied to one face of an aramide fiber reinforced epoxy resin sheet (Trademark: TA-01, manufactured by Teijin Ltd.) as an uncured prepreg 30 by hot rolling (see Steps (a) and (b) in FIG. 6). In this example, the heat resistance of the parting film was not required since it was peeled off prior to the heat pressing step. Then, via holes 20 (diameter: 0.2 mm) were bored using a punching machine at required positions (see (c) in FIG. 6). Next, the via holes 20 were filled with a conducting paste 21 containing copper particles as a conducting filler and an epoxy resin (Epotec 301, manufactured by Epoxy Technologies Ltd.) as a binder using a screen printing method (see (d) in FIG. 6). This operation was carried out while aspirating from the backface of the prepreg 30. The parting film 5 was then peeled off to produce the prepreg 30 having projection electrodes 1 (see FIG. 6(e)).

Figure 6A:
FIG. 6 is a series of sectional views illustrating production steps of forming a printed-circuit board having projection electrodes corresponding to a further example in the present invention.
Figure 6B:
Figure 6C:
Figure 6D:
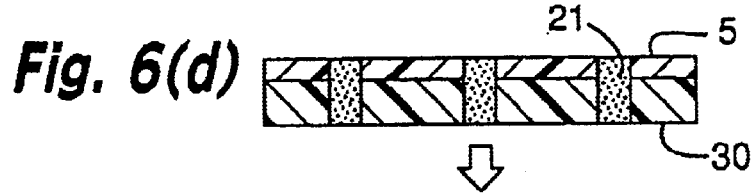
Figure 6E:
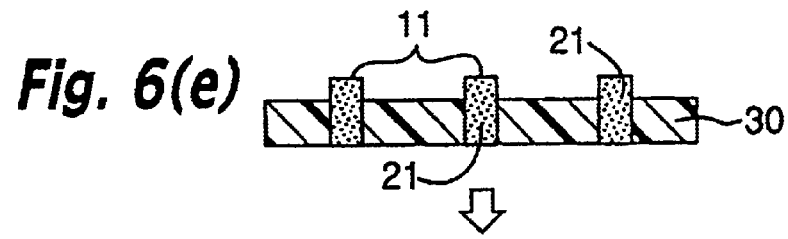
Figure 6F:
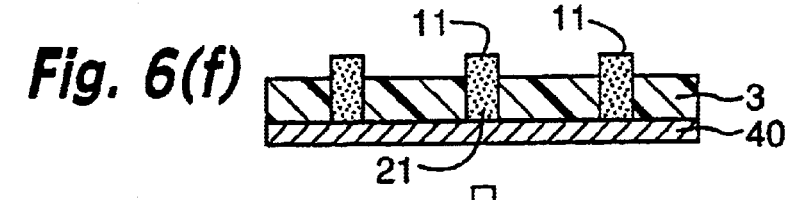
Figure 6G:
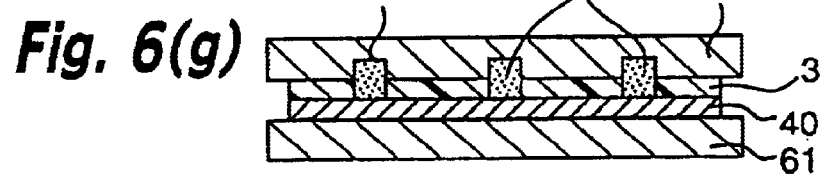
Figure 6H:
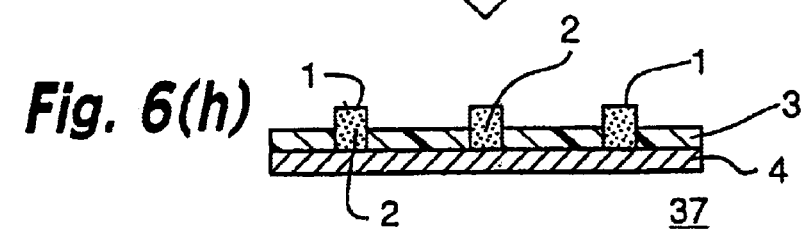

Next, a copper foil 40 (thickness: 0.035 mm) was applied to the face of the prepreg 30, on which the parting film was not applied (see FIG. 6(f)). Then, a pair of flat molds 61 were placed on the surfaces of the prepreg, wherein one of the molds 61 was formed with dome-shaped concave portions 62 on the pressing face thereof, the concave portion having a diameter of 0.2 mm and a depth of 0.3 mm, at the position corresponding to the via hole was aligned with the prepreg 30 and placed on the surface of the side of projection portions 11 of an uncured conducting paste 21 projected from the via hole 20. The substrate interposed with the flat molds 61 was pressed at a temperature of 170° C. and a pressure of 60 to 100 kg/cm$^2$ for one hour to carry out hot pressing bond (see (g) in FIG. 6). The prepreg 30 was compressed by 10% by this pressing and heating operation.

The substrate 3 was separated from the molds 61 to complete a printed-circuit board 37 with projection electrodes composed of a conducting paste (see (h) in FIG. 6).

The concave portion 62 of the mold 61 can be shaped into a desired form so that it is possible to form the projections 1 with a desired three-dimensional form, such as a dome, circular cone, or two-stage form. The projection electrodes having desired forms, can be formed by a single pressing step including heating simultaneously the prepreg 30 and the conducting paste.

FIG. 7 shows sectional views illustrating steps of producing a printed-circuit board having projection electrodes on both faces of the prepreg according to the present invention. This production method is the same as in FIG. 6 except that parting films 5 are applied to the both faces of the prepreg 30 (see Step (b) in FIG. 7). In this example, the parting films 5 were peeled off after the via holes 20 were filled with a conducting paste (see (d) in FIG. 7), to form projections composed of an uncured conducting paste on both faces of the prepreg 30 (see (e) in FIG. 7). A pair of molds 61 formed with dome-shaped concave portion 62 on one of the flat faces thereof at the position corresponding to the via hole were aligned with the prepreg 30 and placed on the both faces of the substrate 3. A pressing step was then performed in the same condition as above (see (f) in FIG. 7). After the pressing step, the parting films 5 applied to the both faces were peeled off to produce a printed-circuit board having projection electrodes 1 which was integrated with via hole conductor 2 composed of a cured conducting paste on both faces of the substrate 3 and had a height corresponding to the thickness of the parting film (see (g) in FIG. 7). After that, the substrate was separated from the molds thereby producing a printed-circuit board 33 with projection electrodes 1.

Example 4

FIG. 8 shows a sectional views as a flow chart illustrating steps of producing the printed-circuit board of the present invention. First, a PET film as parting film 5 which was subjected to releasing treatment was applied to one face of an aramide-epoxy sheet (Trademark: TA-01, manufactured by Teijin Ltd.) as an uncured prepreg 30 (see Steps (a) and (b) in FIGS. 8). Then, via hole 20 (diameter: 0.2 mm) were bored through the prepreg using a carbon dioxide laser at an optional position (see (c) in FIG. 8).

Next, the via holes 20 were filled with a conducting paste 21 containing nickel particles as an conducting filler and an epoxy resin as a binder using a screen printing method (see (d) in FIG. 8). This operation was carried out while aspirating from the backface of the prepreg 30. Next, the parting film 5 was peeled off from the prepreg 30 formed with the parting film on one face thereof to produce the prepreg 36 with projection electrodes material (see (e) in FIG. 8).

While, the parting films 5 were applied to both surfaces of the prepreg 30 and via holes 20 were formed to prepare a prepreg 30 (see (f) to (h) in FIG. 8). The via holes 20 was filled with the same conducting paste as above (see (i) in FIG. 8), the parting film 5 was then peeled off (see (j) in FIG. 8), and copper foils 40 (thickness: 0.035 mm) were applied by hot rolling to both faces of the prepreg 30, from which the parting film 5 had been peeled off (see (k) in FIG. 8). In succession, flat molds 6, 6 were aligned with the both surfaces of the prepreg 30 to press and heat the prepreg 30 through these molds 6 at a temperature of 170° C. and a pressure of 60 to 100 kg/cm² for one hour (see (l) in FIG. 8), carrying out hot pressing bond thereby producing a printed-circuit board 38 provided with a metal layer on both surfaces thereof (see (m) in FIG. 8).

Next, the above prepreg 36 and the cured printed-circuit board 38 were laminated and hot pressed by flat mold 62 formed with two-stage concave portions 62 having a smaller cylinder with a size (diameter of 0.1 mm and a depth of 0.1 mm) on a larger cylinder with a size (diameter of 0.2 mm and a depth of 0.1 mm) was aligned with the prepreg 30 in such a manner that the concave portion 62 is accorded with the projection 11. A plate stainless mold, on the other hand, was aligned with the surface on the side of the copper foil of the printed-circuit board. Each of the two molds was placed on the corresponding face, and the substrate was pressed at a temperature of 170° C. and a pressure of 60 to 100 kg/cm² for one hour using a heat press to carry out thermocompression bond (see (n) in FIG. 8). The substrate was separated from the molds. A required wiring pattern was formed with the copper foil. Thus a multilayer printed-circuit board 31 with two-stage projection electrode 15 composed of a conducting paste was produced (see (o) in FIG. 8).

As is clear from the above explanations, in the printed-circuit board with projection electrodes according to the present invention, the projection electrodes are composed of the same cured conducting paste as the cured conducting paste of the via hole conductors which are embedded into a single-layer circuit board comprising an insulating substrate, or into a multilayer circuit board comprising two or more insulting substrates. Because the embedded via hole conductors were integrated with the projection electrodes, the embedded paste acts as a main support for the projection electrodes whereby the strength of the projection electrode is increased. This has remarkable effects on the improvements in a package yield and package reliability.

According to the present invention, particularly in a flip-chip package, such a structure can be obtained which is resistant to a sheering stress caused by a difference in thermal expansions between the semiconductor device or electronic components and the printed substrate.

The projection electrodes with a desired form such as a dome or two-stage form can be formed by hot press using the molds with concave portions formed at the positions required to correspond to the projections, thereby improving a package yield.

Because the projection electrodes are formed simultaneously when the prepreg and the conducting paste are cured in a hot press step, the production process is simple and high mass production can be attained. Furthermore, the height of the projection electrodes can be defined by the thickness of a parting film. Therefore, the accurate projection electrodes with a height of tens of microns can be easily formed.

The present invention being thus described, it will be obvious that same may be varied in various ways. Such variations are not to be regarded as departures from the spirit and scope of the invention, and all such modifications would be obvious for one skilled in the art and are intended to be included within the scope of the following claims.

What is claimed:

1. A method for producing a printed-circuit board having projection electrodes, the method comprising:

making via holes that penetrate through a prepreg including an insulating resin provided with a parting film which is formed on at least one face thereof and never softens in a heating and pressing operation;

filling the via holes with a conducting paste;

pressing the prepreg under heat to transform the prepreg into a hard substrate; and peeling off the parting film to expose projection electrodes from the substrate after the above substrate-forming operation.

2. A production method according to claim 1, further comprising applying a metal foil onto the surface of the prepreg without a parting film thereon, after the operation of filling the via holes with a conducting paste, followed by the pressing operation.

3. A production method according to claim 1, wherein a parting film is formed on both faces of the prepreg to form projection electrodes on the both faces of the substrate in the operation of forming the via holes in the prepreg.

4. A production method according to claim 1, wherein a parting film is formed on both faces of the prepreg in the step of forming the via holes, and said method further comprises peeling off the parting film from the one face of the prepreg after the step of filling the via holes with the conducting paste, to apply a metal foil to the peeled face on which the via holes have been filled with a conducting paste, followed by the pressing operation.

5. A production method according to claim 1, wherein the prepreg is formed of a porous material and the parting film is a polyimide resin film.

6. A production method according to claim 1, wherein the prepreg is formed of a porous material comprising an aramide fiber reinforced epoxy resin sheet.

7. A production method according to claim 1, wherein the prepreg is formed of a porous material comprising a woven or nonwoven fabric of an aromatic polyimide fiber and a thermosetting resin.

8. A production method according to claim 1, wherein the prepreg is formed of a porous material comprising a glass fiber reinforced epoxy resin sheet.

9. A method for producing a multi layer printed-circuit board having projection electrodes, the method comprising:

laminating a first prepreg, containing an insulating resin, on a second single-layer or multilayer cured circuit board in such a manner that an exposed surface of the first prepreg is brought into contact with the second circuit board, the first prepreg being provided with a parting film formed on one face thereof and via holes filled with a conducting paste and the second circuit board is provided with a metal foil formed on both faces thereof;

pressing under heat to cure the prepreg and the conducting paste; and peeling off the parting film after said pressing operation.

10. A production method according to claim 9, wherein the first prepreg is formed of a porous material and the parting film is a polyimide resin film.

11. A production method according to claim 9, wherein the prepreg is formed of a porous material comprising an aramide fiber reinforced epoxy resin sheet.

12. A production method according to claim 9, wherein the prepreg is formed of a porous material comprising a woven or nonwoven fabric of an aromatic polyimide fiber and a thermosetting resin.

13. A production method according to claim 9, wherein the prepreg is formed of a porous material comprised of a glass fiber reinforced epoxy resin sheet.

14. A method for producing a printed-circuit board having projection electrodes, the method comprising:

forming via holes in a prepreg containing an insulating resin and provided with a parting film on one face or both faces thereof;

filling the via holes with a conducting paste;

peeling off the parting film from the prepreg after the filling operation; and pressing the substrate under heat using molds having projection-forming concave portions at positions corresponding to the via holes which have been filled with the conducting paste.

15. A production method according to claim 14 which further comprises applying a metal foil onto one face of the prepreg from which the parting film is peeled off, after the peeling operation, followed by the pressing operation.

16. A production method according to claim 14, wherein the parting film is formed on both faces of the prepreg to form projection electrodes on the both faces of the cured substrate in the step of forming the via holes in the prepreg.

17. A production method according to claim 14, wherein the prepreg is formed of a porous material and the parting film is a polyimide resin film.

18. A production method according to claim 14, wherein the prepreg is formed of a porous material is made comprising an aramide fiber reinforced epoxy resin sheet.

19. A production method according to claim 14, wherein the prepreg is formed of a porous material comprising a woven or nonwoven fabric of an aromatic polyimide fiber and a thermosetting resin.

20. A production method according to claim 14, wherein the prepreg is formed of a porous material comprised of a glass fiber reinforced epoxy resin sheet.

21. A method for producing a printed-circuit board having projection electrodes, the method comprising:

laminating a first prepreg, containing an insulating resin, on a second cured circuit board in such a manner that an exposed surface of the first prepreg is brought into contact with the second circuit board, the first prepreg being provided with a parting film formed on one face thereof and via holes filled with a conducting paste, and the second circuit board is provided with a metal foil formed on both faces thereof;

pressing a surface on the side of the parting film of the first prepreg under heat using molds having projection-forming concave portions at positions corresponding to the via holes which have been filled with the conducting paste to cure the prepreg and the conducting paste; and peeling off the parting film after the pressing operation.

22. A production method according to claim 21, wherein the first prepreg is formed of a porous material and the parting film is a polyimide resin film.

23. A production method according to claim 21, wherein the first prepreg is formed of a porous material comprising an aramide fiber reinforced epoxy resin sheet.

24. A production method according to claim 21, wherein the prepreg is formed of a porous material comprising a woven or nonwoven fabric of an aromatic polyimide fiber and a thermosetting resin.

25. A production method according to claim 21, wherein the prepreg is formed of a porous material comprised of a glass fiber reinforced epoxy resin sheet.

* * * * *